United States Patent
Steckler et al.

(10) Patent No.: US 7,698,809 B2
(45) Date of Patent: Apr. 20, 2010

(54) APPARATUS AND METHOD FOR DETECTING A LOCATION OF CONDUCTIVE PINS WITH RESPECT TO A CIRCUIT BOARD

(75) Inventors: John Trent Steckler, Schwenksville, PA (US); Peter John Borisuk, Abington, PA (US); José Ramon Rivera, Harleysville, PA (US)

(73) Assignee: Tyco Electronics Corporation, Middletown, PA (US)

( * ) Notice: Subject to any disclaimer, the term of this patent is extended or adjusted under 35 U.S.C. 154(b) by 376 days.

(21) Appl. No.: 11/716,772

(22) Filed: Mar. 12, 2007

(65) Prior Publication Data

US 2007/0264849 A1 Nov. 15, 2007

Related U.S. Application Data

(60) Provisional application No. 60/800,094, filed on May 12, 2006.

(51) Int. Cl.
*H01R 43/20* (2006.01)
(52) U.S. Cl. .............................. 29/747; 29/593; 29/755; 29/709; 324/754; 324/758; 324/158.1
(58) Field of Classification Search .................. 29/593, 29/705, 739, 747, 832, 834, 837, 842, 845; 439/55, 73–75, 79, 43–46, 49, 51–54, 189; 324/158.1, 754, 761, 765, 755, 756, 758; 361/785, 791
See application file for complete search history.

(56) References Cited

U.S. PATENT DOCUMENTS

| | | | |
|---|---|---|---|
| 4,357,062 A * | 11/1982 | Everett | 439/54 |
| 4,825,538 A | 5/1989 | Kubis | |
| 5,663,655 A * | 9/1997 | Johnston et al. | 324/761 |
| 5,818,248 A * | 10/1998 | St. Onge | 324/761 |
| 6,685,498 B1 * | 2/2004 | Jones et al. | 439/482 |
| 6,894,480 B2 * | 5/2005 | Back | 324/158.1 |
| 7,068,039 B2 * | 6/2006 | Parker | 324/519 |
| 2002/0104683 A1 | 8/2002 | Teshima et al. | |
| 2003/0147217 A1 | 8/2003 | Koike et al. | |
| 2004/0115970 A1 | 6/2004 | Sakata | |

FOREIGN PATENT DOCUMENTS

EP    1 341 270    9/2003

OTHER PUBLICATIONS

International Search Report PCT/US2007/011427; dated Jan. 29, 2008.

* cited by examiner

*Primary Examiner*—Derris H Banks
*Assistant Examiner*—Jeffrey Carley

(57) ABSTRACT

An apparatus for detecting a location of conductive pins with respect to a circuit board during an assembly process using a press tool to mate the circuit board and the conductive pins includes a detector housing holding a plurality of switches aligned with corresponding conductive pins, wherein the detector housing is configured to be mounted to the press tool used during the assembly process. The switches change state based on the location of the conductive pins with respect to the circuit board. The apparatus further includes a sensor electrically coupled with the plurality of switches, wherein the sensor monitors the change of state of each switch to indicate that the respective conductive pins are properly mated with the circuit board.

18 Claims, 3 Drawing Sheets

APPARATUS AND METHOD FOR DETECTING A LOCATION OF CONDUCTIVE PINS WITH RESPECT TO A CIRCUIT BOARD

CROSS REFERENCE TO RELATED APPLICATIONS

This application claims the benefit of a provisional patent application having Ser. No. 60/800,094, titled COMPLIANT PIN PENETRATION DETECTION APPARATUS AND METHOD OF USING SAME, filed on May 12, 2006, the subject matter of which is hereby incorporated by reference in its entirety.

BACKGROUND OF THE INVENTION

This invention relates generally to assembling electronic components to printed circuit boards (PCB), and more particularly, to an apparatus and method for detecting the penetration of compliant pins through the PCB during assembly.

In many current electronic assemblies, electronic components, such as connectors and insert-molded housings, are attached to or mounted on PCBs. These assemblies require a suitable mechanical attachment and a proper electrical contact between the component and the PCB. Various machines and manufacturing processes automatically assemble or attach the various electronic components to the PCBs. One means for attaching the component to the PCB is by a press-fit pin or compliant pin. The compliant pin is press-fit into an opening or hole in the PCB to provide both an electrical and mechanical mounting between the component and the PCB. An example of a compliant pin application is electrical control modules used in automobiles. A control module is assembled by pressing the PCB onto the compliant pins of the housing of a module until the PCB is fully seated. Other types of compliant pin products, such as connectors, are manufactured in a similar manner. A typical component includes an array of electrical contact pins that have a compliant section at the tip of the pin. This compliant section of the pin is larger than the receiving holes in the PCB, creating an interference fit with the receiving holes of the PCB and thereby, generating a firm electrical contact.

In order to verify a proper assembly, the manufacturing process must include feedback to ensure that the compliant portion of the pin properly penetrated the PCB and is making good electrical contact with the PCB. Currently, the feedback is generated by visually inspecting the assembly either during or after assembly, by either manual or vision inspection equipment. The manual method is subjective because it is operator dependent and the amount of penetration can not be quantified. Additionally, because the components of the PCB must be supported by the manufacturing equipment or tooling, it is difficult or even impossible to visually inspect during the assembly process. Thus, an additional step to visually inspect must come after the assembly process. Likewise, using vision inspecting equipment is a second manufacturing operation and is expensive.

Thus, a need remains for providing feedback to ensure proper penetration and a need remains for generating feedback during the manufacturing process.

BRIEF DESCRIPTION OF THE INVENTION

In one embodiment, an apparatus is provided for detecting a location of conductive pins with respect to a circuit board during an assembly process using a press tool to mate the circuit board and the conductive pins. The apparatus includes a detector housing holding a plurality of switches aligned with corresponding conductive pins, wherein the detector housing is configured to be mounted to the press tool used during the assembly process. The switches change state when the conductive pins penetrate through the circuit board by a predetermined amount. The apparatus further includes a sensor electrically coupled with the plurality of switches, wherein the sensor monitors the change of state of each switch to indicate that the respective conductive pins are properly mated with the circuit board.

Optionally, the switches may include electrical probes resting on a ground plate and being grounded thereto, wherein each of the probes is electrically connected to the sensor. The switches may be normally closed, and the switches may be changed to an open state when the respective conductive pin penetrates through the circuit board. Optionally, the apparatus may further include a ground plate, wherein each of the switches normally rest on the ground plate, and wherein the switches are mechanically lifted off the ground plate to change the state of the switches. Optionally, the press tool may define a press block having a circuit board engagement surface configured to engage and press the circuit board onto the conductive pins, wherein the detector housing is mounted to the press block opposite the circuit board engagement surface.

Optionally, the switches may be physically moved by corresponding transfer elements configured to engage the conductive pins during the assembly process, wherein the switches may be moved from a grounded state, wherein the switches are electrically grounded, to a compliance state, wherein the switches are no longer electrically grounded. The transfer elements may be movably coupled within the housing, wherein the transfer elements are configured to engage the conductive pins when the conductive pins penetrate through the circuit board. Optionally, when the pins penetrate the circuit board the transfer elements may lift the probes off of the ground plate to create open circuits, and the sensor may detect the open circuit of each of the corresponding probes. Each transfer element may includes an interface pin at the pin end and an insulator pin between the interface pin and the switch end, wherein the insulator pin electrically isolates the conductive pin from the switch.

In another embodiment, a detector apparatus is provided for detecting an amount of penetration of compliant pins with respect to a circuit board during an assembly process. The detector apparatus includes a press block having a circuit board engagement surface configured to engage and press the circuit board onto the compliant pins, wherein the compliant pins penetrate through holes in the circuit board and are electrically connected to the circuit board as the circuit board is pressed into position by the press block. A plurality of probes are housed within a probe holder, and the probe holder is supported by the press block opposite the circuit board engagement surface. Each of the probes are configured to detect an amount of penetration of a corresponding one of the compliant pins through the circuit board. A sensor is electrically connected to each of the probes, wherein the sensor detects that each of the compliant pins have penetrated through the circuit board by a predetermined amount.

In a further embodiment, a method is provided of detecting penetration of conductive pins into a circuit board, wherein the method includes placing a component having conductive pins on a support and placing a circuit board having pin holes over the component, wherein the pin holes are substantially aligned with the conductive pins. The method further includes lowering a press tool onto the circuit board, wherein the press tool including a plurality of switches aligned with corresponding conductive pins, and wherein the switches change state based on the location of the conductive pins with respect to the circuit board. The method also includes monitoring the change of state of each switch using a sensor electrically connected to each switch, wherein the change of state of each switch indicates that the respective conductive pin is properly mated with the circuit board.

DETAILED DESCRIPTION OF THE INVENTION

Figure 1:
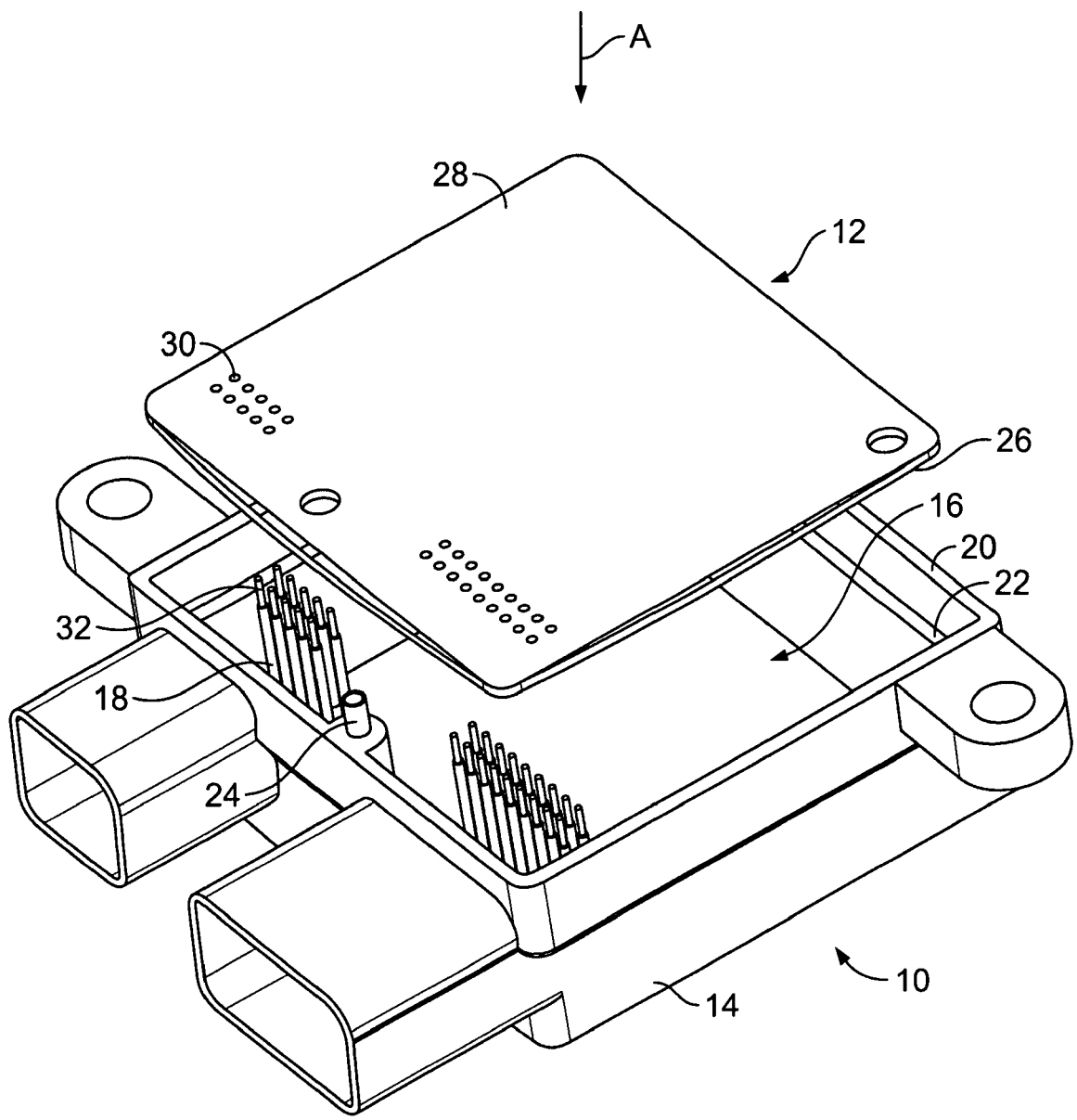
FIG. 1 is a perspective view of a typical component and PCB to be assembled.

FIG. 1 is a perspective view of a typical component 10, such as a control module or other type of electrical connector, and a printed circuit board (PCB) 12 that is to be mounted to the component 10. The component 10 includes a molded plastic housing 14 that defines a pocket 16. A plurality of conductive pins 18 are positioned within the pocket 16 in a predetermined orientation. In the illustrated embodiment, the conductive pins 18 are compliant pins, and may be referred to hereinafter as compliant pins 18. The various embodiments are in no way limited to compliant pins 18, and the detection apparatus 40 (shown in FIG. 2) may be used to detect the relative location of any type of pin with respect to the PCB 12. In the illustrated embodiment, a compliant portion of each compliant pin 18 is provided at the tip of the compliant pins 18. The compliant pins 18 are arranged as sets of compliant pins 18, wherein each set includes two rows of compliant pins 18. Other arrangements may be used depending on the particular application. The compliant pins 18 have a predetermined pitch, such as a two millimeter pitch between the compliant pins 18. The pitch may be greater than or less than two millimeters in alternative embodiments.

The housing 14 includes an open top 20 that provides access to the pocket 16 and the compliant pins 18. A lip 22 extends along the inner perimeter of the housing 14 proximate to the top 20. The PCB 12 is loaded into the pocket 16 through the top 20, such as in the direction of arrow A, and is seated on the lip 22. Optionally, alignment features 24 extend from the lip 22 to align the PCB 12 within the pocket 16. Fasteners (not shown) may be used to secure the PCB within the pocket 16.

The PCB 12 includes an inward facing surface 26 and an outward facing surface 28. The inward facing surface 26 faces the interior of the pocket 16 when the PCB 12 is mounted to the component 10. The outward facing surface 28 is exposed through the top 20 of the housing 14 when the PCB 12 is mounted to the component 10. Optionally, the outward facing surface 28 may be substantially flush with the top 20 when the PCB 12 is mounted to the component 10. The PCB 12 includes a plurality of thru holes 30 extending through the PCB 12. In an exemplary embodiment, the thru holes 30 are plated and are oriented to mate with, and electrically connect to, the compliant pins 18 when the PCB 12 is loaded into the pocket 16. During assembly, as the PCB 12 is pressed into position within the housing 14, each compliant pin 18 penetrates through a corresponding thru hole 18 and a tip 32 of the compliant pin 18 extends above the PCB 12 by a predetermined amount. Optionally, the compliant section of compliant pin 18 is slightly larger than the thru hole 30 of the PCB 12, such that a press-fit or interference fit is created between the compliant pin 18 and the PCB 12. A firm electrical contact may be created therebetween, and the PCB 12 may be retained within the housing 14 by such a fit.

Figure 2:
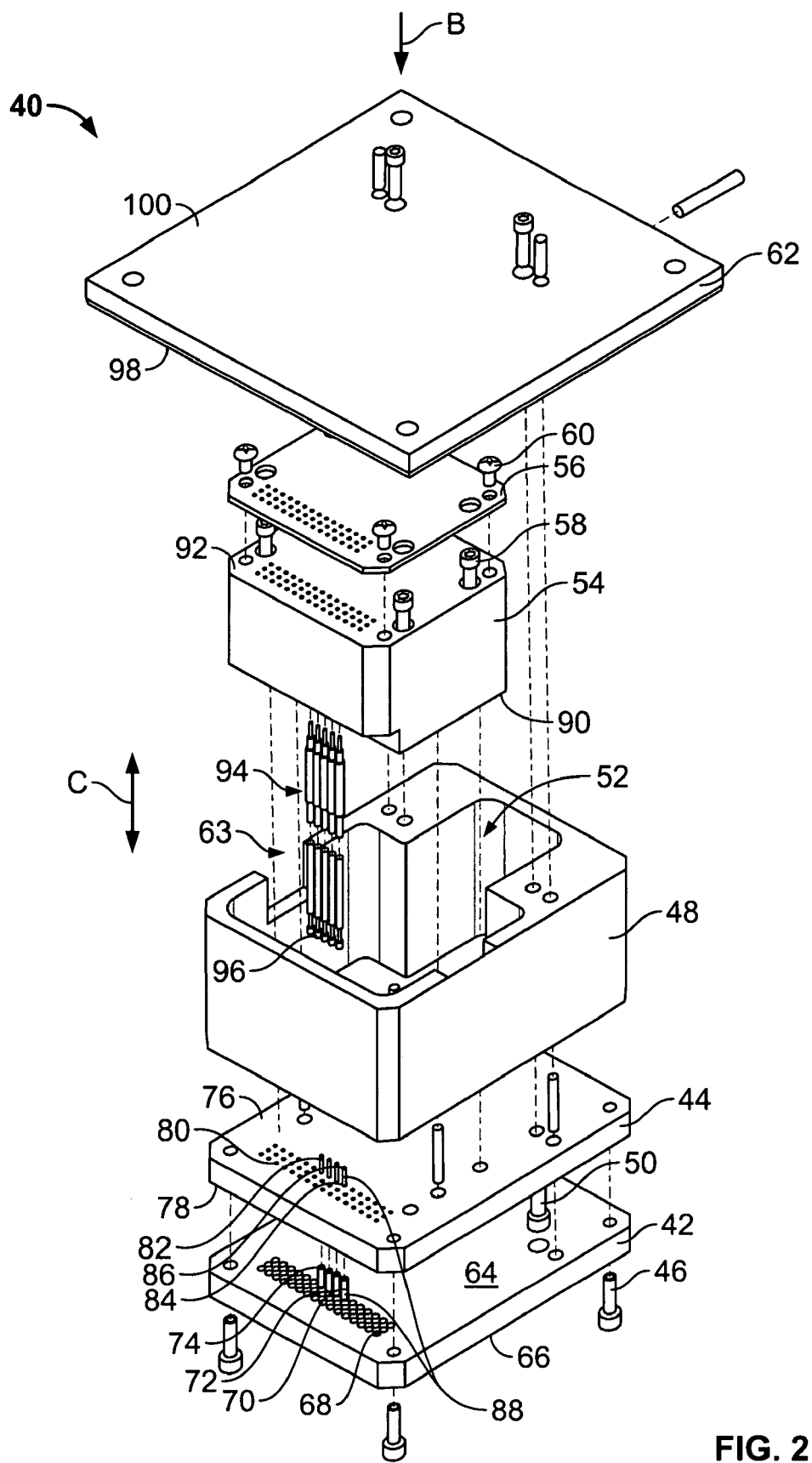
FIG. 2 is an exploded perspective view of an exemplary embodiment of a detection apparatus.

FIG. 2 is an exploded perspective view of an exemplary embodiment of a detection apparatus 40 for detecting the location of the compliant pins 18 (shown in FIG. 1) with respect to the PCB 12 (shown in FIG. 1). Optionally, the detection apparatus 40 may be used to detect compliant loading of the PCB 12 onto the compliant pins 18 during the assembly process. For example, the detection apparatus 40 may be used to detect an amount of penetration of each compliant pin 18 into, and beyond, the PCB 12. The detection apparatus 40 may be used in conjunction with, or alternatively, the detection apparatus 40 may be used as, an assembly, such as a press tool, for pressing the PCB 12 onto the compliant pins 18. For example, the detection apparatus 40 may receive a pressing force along a single axis, such as in the direction of arrow B, from a machine (not shown), such as a press, which presses the PCB 12 into position, as explained in further detail below. Optionally, the detection apparatus 40 may be retrofit to an existing press tool to facilitate monitoring the location and/or amount of penetration of the compliant pins 18 during the assembly process. Alternatively, the detection apparatus 40 may be used as a support, such as to support the PCB 12, and a press tool may be used to lower the component 10 onto the PCB 12.

The detection apparatus 40 includes a press block 42 at a base thereof. The press block 42 operates as the assembly for mating the PCB 12 and the compliant pins 18 during the assembly process. A ground plate 44 is supported by, and coupled to, the press block 42 using fasteners 46. A casing 48 is coupled to the ground plate 44 and/or the press block 42 using fasteners 50. The casing 48 includes an inner cavity 52 therein. A detector housing 54 and a sensor 56 are positioned within the inner cavity 52. The detector housing 54 is supported by, and is coupled to, the ground plate 44 using fasteners 58. The sensor 56 is supported by, and is coupled to the detector housing 54 using fasteners 60. A top plate 62 is coupled to the casing 48 and covers the inner cavity 52. Optionally, dowel pins may be used in addition to the fasteners to align and/or stabilize the various components with respect to one another.

In operation, a force is applied to the top plate 62 by a machine, such as a press, and the force is transferred by the casing 48 and the ground plate 44 to the press block 42. The force is then imparted onto the PCB 12 (shown in FIG. 1) by the press block 42, and the PCB 12 is lowered onto the compliant pins 18. In order to detect compliant mating or loading of the PCB 12 onto the compliant pins 18, the detector apparatus 40 may be used. For example, in an exemplary embodiment, the detector housing 54 includes a plurality of switches 63 that are electrically connected to the sensor 56, and the sensor 56 is configured to monitor the state of each of the switches. The switches 63 detect the location of the compliant pins 18 with respect to the PCB 12, such as by detecting the amount of penetration of the compliant pins 18 through the PCB 12. For example, when the compliant pins 18 penetrate by a predetermined amount, the switches 63 may change state. In an exemplary embodiment, the amount of pin 18 exposed beyond the PCB 12 is measured using the switches 63. Optionally, the switches 63 may be normally closed and have a closed state, wherein the switches 63 are grounded, and an open state, wherein the switches 63 are no longer grounded and an open circuit is created. Alternatively, the switches 63 may be normally opened, and the sensor 56 may detect when a closed circuit is created. In an exemplary embodiment, the switches 63 may include electrical probes 94 that cooperate with, and create a switch with, the ground plate 44. In such an embodiment, the detector housing 54 functions as a probe holder configured to hold a plurality of the probes 94 therein, and the detector housing 54 is sometimes referred to hereinafter as a probe holder 54.

The press block 42 includes opposed top and bottom surfaces 64 and 66. The bottom surface 66 defines a circuit board engagement surface and is arranged to engage the top surface of the PCB 12. Optionally, the press block 42 may have an outer perimeter that has a substantially similarly shape as the PCB 12. Alternatively, the press block 42 may engage only a portion of the PCB 12. Optionally, a portion of the press block 42 may fit within the pocket 16 (shown in FIG. 1) of the component 10 (shown in FIG. 1) during mating of the PCB 12 with the component 10.

Figure 3:
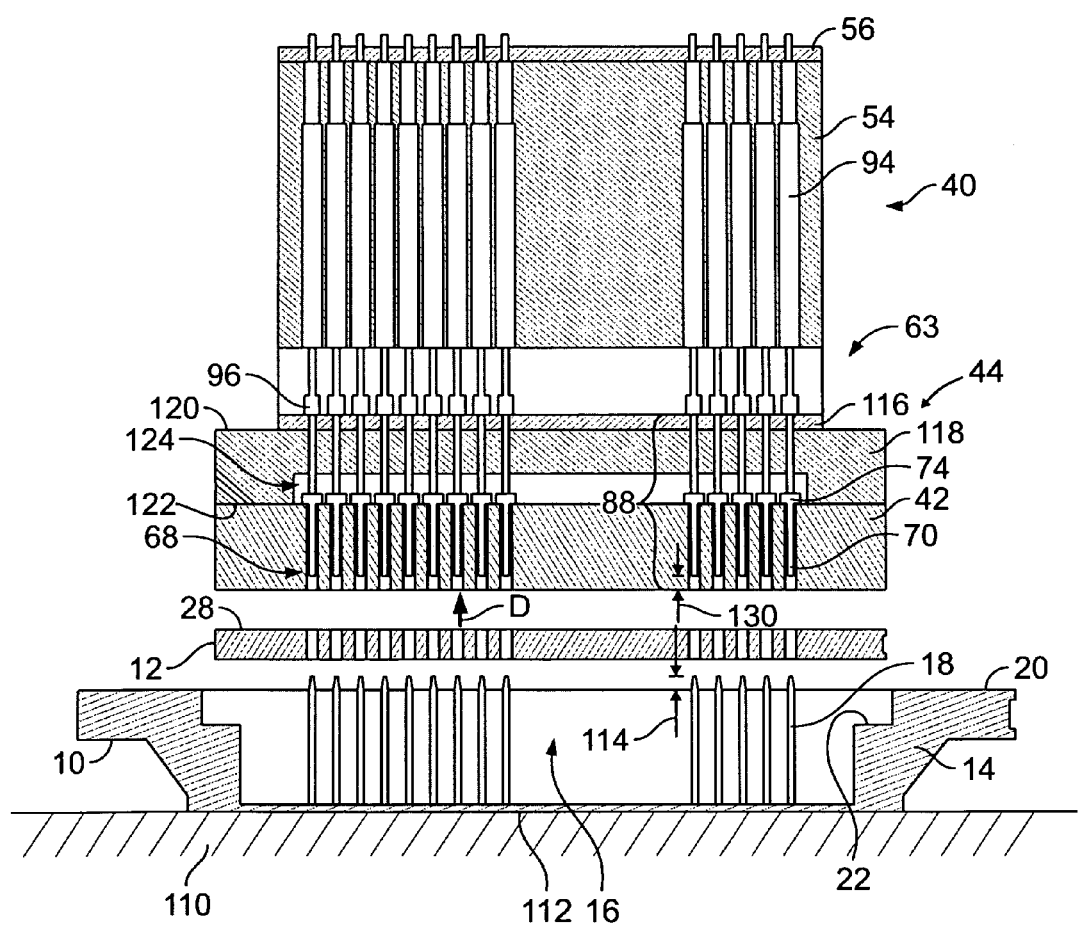
FIG. 3 is a cross sectional view of the detection apparatus shown in FIG. 2 operatively positioned with respect to the component and PCB shown in FIG. 1.

A plurality of receiving holes 68 extend through the press block 42 between the top and bottom surfaces 64, 66. Interface pins 70 are loaded into the receiving holes 68. In the illustrated embodiment, four interface pins 70 are illustrated, however, any number of interface pins 70 may be used depending on the particular application. The interface pins 70 are movable with respect to the press block 42 in an axial direction, or a direction parallel to the axis of the pins, which is shown generally by arrow C. The interface pins 70 extend between opposed ends. A bottom end, as oriented in FIG. 2, defines a compliant pin end 72 and is oriented within the receiving hole 68 to engage the compliant pin 18 (shown in FIG. 1) as the compliant pin penetrates the PCB 12. The engagement with the compliant pin 18 is illustrated in FIG. 3, and will be described in further detail below. The top end, as oriented in FIG. 2, defines a headed end 74 having a greater diameter then the body of the interface pin 70. The headed end 74 has a larger diameter than the receiving hole 68 such that the headed end 74 rests upon the top surface 64 of the press block 42 and restricts further downward movement of the interface pin 70. The interface pin 70 is free to move generally upward toward the top plate 62, as will be explained in further detail below.

The ground plate 44 includes opposed top and bottom surfaces 76 and 78. The bottom surface 78 of the ground plate 44 rests upon the top surface 64 of the press block 42. Optionally, the bottom surface 78 of the ground plate 44 may be spaced apart from the top surface 64 of the press block 42, or a spacer may be positioned therebetween. The ground plate 44 is fabricated from a conductive material, and operates as a ground surface for conductive elements attached thereto. In an alternative embodiment, the ground plate 44 may include a non-conductive support and a conductive insert that defines a grounding area, wherein the conductive elements are attached to the grounding area. Optionally, the ground plate 44 may have a substantially similarly sized and shaped outer perimeter as the press block 42.

A plurality of receiving holes 80 extend through the ground plate 44 between the top and bottom surfaces 76, 78. Insulator pins 82 are loaded into the receiving holes 80. In the illustrated embodiment, four insulator pins 82 are illustrated, however, any number of insulator pins 82 may be used depending on the particular application. The insulator pins 82 are movable with respect to the ground plate 44 in an axial direction, or a direction parallel to the axis of the pins, which is shown generally by arrow C. The insulator pins 82 extend between opposed ends. A bottom end 84, as oriented in FIG. 2, rests upon, and is supported by, the headed end 74 of a corresponding one of the interface pins 70. A top end 86, as oriented in FIG. 2, defines a switch end or a probe end. The insulator pins 82 are fabricated from a non-conductive material, such as a plastic material, and electrically isolate the interface pins 70 from the ground plate 44. The interface pins 70 and the insulator pins 82 cooperate to define transfer elements 88. Alternatively, rather than having two pins, namely the interface pin 70 and the insulator pin 72, combined to form each transfer element 88, the transfer elements may be a single pin extending between the compliant pins 18 and the switches 63.

The probe holder 54 extends between a bottom 90 and a top 92. The sensor 56 is coupled to the top 92. The probe holder 54 holds a plurality of electrical probes 94 therein. The probes 94 are used to detect the penetration of the compliant pins 18 through the PCB 12, as will be explained in further detail below. In the illustrated embodiment, five probes 94 are illustrated, however, any number of probes 94 may be used depending on the particular application. Optionally, an equal number of probes 94 may be used as compared to the number of compliant pins 18, and the layout of probes 94 may be the same as the layout of the compliant pins 18, such that the penetration of each compliant pin 18 may be detected using a corresponding probe 94. Alternatively, less probes 94 may be used than the number of compliant pins 18, wherein the probes 94 are selectively positioned to detect penetration of particular ones of the compliant pins 18. The probes 94 may be spaced apart and detect multiple sub-sets of the compliant pins 18, or the probes may be spaced together, such as to detect the penetration at an interior sub-set of the compliant pins 18. Optionally, the probe holder 54 may include individual holes extending at least partially therethrough for receiving, and electrically isolating, respective ones of the probes 94 from one another. Alternatively, a single opening may be provided to receive each of, or multiple ones of, the probes 94. In an exemplary embodiment, the probes 94 are spring loaded pogo pins.

The probes 94 generally define, and represent one type of, switch 63 that may be used with the detection apparatus. However, other types of switches 63 may be used in alternative embodiments, such as pins, traces, circuits, devices, mechanisms, and the like that detect the location of the compliant pins 18 with respect to the PCB 12 to determine compliant mating of the compliant pins 18 and the PCB 12. The probes 94 are electrically connected to the sensor 56. A tip 96 of each probe 94 rests upon the ground plate 44 and is electrically grounded thereto. The tip 96 is movable off of the ground plate 44 to create an open circuit. The sensor 56 senses when the probe 94 is grounded and when the probe is lifted off the ground plate 44. The probe holder 54 is positioned within the inner cavity 52 of the casing 48 to isolate the probe holder 54 and the sensor 56 from forces imposed on the detector apparatus 40 by the machine. The top plate 62 also isolates the probe holder 54 and the sensor 56 from forces imposed by the machine. A bottom surface 98 of the top plate 62 rests upon the casing 48. A top surface 100 of the top plate 62 is exposed.

FIG. 3 is a cross sectional view of the detection apparatus 40 operatively positioned with respect to the component 10 and PCB 12. The detection apparatus 40 is illustrated as having an equivalent number of probes 94 as compliant pins 18, such that the penetration of each compliant pin 18 may be detected by a corresponding probe 94. The component 10 is positioned upon a support surface 110. The compliant pins 18 extend upward from a base 112 of the housing 14. In the illustrated embodiment, the compliant pins 18 extend above the top 20 of the component 10 for a height 114. The PCB 12 is received within the pocket 16 and rests upon the lip 22 such that the top surface 28 of the PCB 12 is flush with the top 20 of the component 10. In alternative embodiments, the PCB 12 may be recessed below the top 20, or may be elevated above the top 20. As such, when the PCB is loaded into the pocket 16, the compliant pins 18 extend above the top surface 28 by the same height 114.

FIG. 3 illustrates the detector apparatus 40 in an assembled state, with the casing 48 (shown in FIG. 2) and the top plate 62 (shown in FIG. 2) removed for clarity. In an alternative embodiment, the detector apparatus 40 may be used without the casing 48 or the top plate 62. As illustrated in FIG. 3, the press block 42 is aligned with the PCB 12 and the ground plate 44 is provided on the press block 42.

The ground plate 44 in the embodiment of FIG. 3 is different than the ground plate 44 in the embodiment of FIG. 2, in that the ground plate 44 is represented by a thin conductive body 116 attached to a spacer 118. The spacer 118 may be conductive or non-conductive, depending on the application. The spacer 118 has a top 120 and a bottom 122, wherein the conductive body 116 is coupled to the top 120 and the bottom 122 rests upon the press block 42. The spacer 118 includes a recess 124 at the bottom 122 above each of the receiving holes 68 in the press block 42. The recess 124 provides a space for the headed ends 74 of the interface pins 70 to extend when the interface pins 70 are elevated. In the illustrated embodiment, the probe holder 54 is positioned above the conductive body 116 and the sensor 56 is positioned above the probe holder 54. The probes 94 rest on the conductive body 116. Optionally, one end of the probes 94 defines a receptacle and may be fixed within the probe holder 54 and/or soldered to the sensor 56. The other end of the probes 94 are movably received within the receptacles and may be retained therein, such as by a snap-fit.

The compliant pins 18 are arranged in a predetermined arrangement having a pitch or spacing therebetween. Optionally, the compliant pins 18 may be arranged in more than one grouping or sub-set. The transfer elements 88, each including one interface pin 70 and one insulator pin 82, are aligned along the axes of the compliant pins 18. In alternative embodiments, the transfer elements 88 may be a single pin extending between the compliant pins 18 and the probes 94. In such embodiments, the transfer elements 88 may be insulative, or a separate insulative element may be positioned between the transfer elements 88 and the corresponding pins 18 or probes 94 to electrically isolate the compliant pins 18 from the probes 94. The probes 94 are aligned with corresponding ones of the transfer elements 88 and compliant pins 18.

In operation, the PCB 12 is aligned with the component 10 and the detector apparatus 40 presses the PCB 12 down onto the compliant pins 18. The pressing continues until the compliant pins 18 penetrate through the PCB 12 and are exposed above the outward facing surface 28 of the PCB 12. The receiving holes 68 in the press block 42 allow the compliant pins 18 to come through the PCB 12 and enter into the press block 42. Based on the product being assembled, the amount of penetration into the PCB 12 and press block 42 may vary. However, a minimal amount of penetration is specified for each product to ensure a "good" assembly.

When the compliant pins 18 enter the press block 42, the tips 32 of the compliant pins 18 contact the interface pins 70 inside the press block 42 and push the interface pins 70 upward, shown generally by the arrow D. In turn, the interface pins 70 push the insulator pins 82 upward. Similarly, the insulator pins 82 push the probes 94 upward, lifting the tips 96 of the probes 94 off the ground plate 44. In an exemplary embodiment, the interface pins 70 are elevated from the bottom surface 66 of the press block 42 by a distance 130. The distance 130 is less than the height 114 of the compliant pins 18 such that the compliant pins 18 engage the interface pins 70 and raise the interface pins 70 by an amount equal to the difference between the height 114 and the distance 130. The distance 130 determines how much minimal pin penetration must take place in order to lift the probes 94 off of the ground plate 44. Optionally, the distance 130 may be adjusted depending on the particular application.

The probes 94 are also electrically connected to the sensor 56, which may include a printed circuit board having a microprocessor. The sensor 56 sends signals through the probes 94 to the ground plate 44 at all times. When the probes 94 are lifted off the ground plate 44, the electrical ground is lost, and an open circuit is sensed by the sensor 56. Optionally, when the open circuit is created by raising the probes 94 during assembly, the sensor 56 senses and communicates such an event to a central controller (not shown) which indicates to an operator that the PCB 12 has been properly loaded and attached to the compliant pins 18 of the component 10. Each probe 94 may be monitored simultaneously, and in the embodiment wherein each compliant pin 18 is being monitored by a corresponding probe 94, the amount of penetration of each compliant pin 18 may be monitored by the system.

A detector apparatus 40 is thus provided that verifies proper penetration of a plurality of compliant pins 18 during the assembly processes. The detector apparatus 40 uses switches 63, which have been describe in the illustrated embodiments as probes 94 used to monitor the penetration of the compliant pins 18 by physically transferring the amount of penetration to the probes 94. Transfer elements 88 are raised within the detector apparatus as the PCB 12 is loaded onto the compliant pins 18, and as the transfer elements 88 are raised, the probes 94 are lifted off of a ground plate 44. The removal of the probes 94 from the ground plate 44 is sensed by a sensor 56 and signals are communicated to a central controller notifying the operator that each of the compliant pins 18 have properly penetrated the PCB 12. Accordingly, the detector apparatus 40 reliably detects proper penetration of the compliant pins 18 during assembly, and eliminates the need to inspect the component 10 after the assembly process. Additionally, the probes 94 allow for tight spacing therebetween, which allows the detection apparatus 40 to directly detect the penetration of many of the compliant pins 18, and/or to detect the penetration of an array of compliant pins 18.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An apparatus for detecting a location of conductive pins with respect to a circuit board during an assembly process using a press tool to mate the circuit board and the conductive pins, the apparatus comprising:
   a detector housing holding a plurality of switches aligned with corresponding conductive pins, the detector housing configured to be mounted to the press tool used during the assembly process, wherein the switches change state when the conductive pins penetrate through the circuit board by a predetermined amount; and
   a sensor electrically coupled with the plurality of switches, the sensor monitoring the change of state of each switch to indicate that the respective conductive pins are properly mated with the circuit board.

2. The apparatus of claim 1, wherein the switches comprise electrical probes having probe tips resting on a ground plate and being grounded thereto, each of the probes being electrically connected to the sensor, the probe tips being movable away from the around plate when the switches change state.

3. The apparatus of claim 1, wherein the switches are normally closed, the switches being changed to an open state when the respective conductive pin penetrates through the circuit board.

4. The apparatus of claim 1, further comprising a ground plate, each of the switches normally resting on the ground plate, wherein the switches are mechanically lifted off the ground plate to change the state of the switches.

5. The apparatus of claim 1, further comprising transfer elements movably coupled within the detector housing, the transfer elements being separate and distinct from the switches and engaging the switches, the transfer elements being configured to engage and be moved by the conductive pins when the conductive pins penetrate through the circuit board to change the state of the switches.

6. The apparatus of claim 1, further comprising transfer elements extending between a pin end and a switch end, each pin end configured to engage a tip of a respective one of the conductive pins when the conductive pins penetrate through the circuit board during the assembly process, and each switch end configured to engage a respective one of the switches, wherein penetration of the conductive pins moves the transfer elements in the direction of penetration, and the movement of the transfer elements is transferred to the switches to change the state of the switches.

7. The apparatus of claim 6, wherein the switches comprise electrical probes resting on a ground plate and being grounded thereto, wherein when the conductive pins penetrate the circuit board the transfer elements lift the probes off of the ground plate to create open circuits, wherein the sensor detects the open circuit of each of the corresponding probes.

8. The apparatus of claim 6, wherein each transfer element includes an interface pin at the pin end and an insulator pin between the interface pin and the switch end, the insulator pin electrically isolates the conductive pin from the switch.

9. The apparatus of claim 1, wherein the switches are physically moved by corresponding transfer elements configured to engage the conductive pins during the assembly process, the switches being moved from a grounded state, wherein the switches are electrically grounded, to a compliance state, wherein the switches are no longer electrically grounded, the sensor detecting the state of each switch.

10. The apparatus of claim 1, wherein the press tool comprises a press block having a circuit board engagement surface configured to engage and press the circuit board onto the conductive pins, the detector housing being mounted to the press block opposite the circuit board engagement surface.

11. The apparatus of claim 10, wherein the press tool comprises a press block having a circuit board engagement surface configured to engage and press the circuit board onto the conductive pins, the press block having holes therethrough, wherein the transfer elements are received within respective ones of the holes.

12. The apparatus of claim 1, further comprising an equal number of switches as compliant pins being connected to the circuit board, wherein the sensor is configured to sense the penetration of every compliant pin being connected to the circuit board.

13. A method of detecting penetration of conductive pins into a circuit board, the method comprising:
   placing a component having conductive pins on a support;
   placing a circuit board having pin holes over the component, wherein the pin holes are substantially aligned with the conductive pins;
   lowering a press tool onto the circuit board, the press tool including a plurality of switches aligned with corresponding conductive pins, wherein the switches change state based on the location of the conductive pins with respect to the circuit board; and
   monitoring the change of state of each switch using a sensor electrically connected to each switch, the change of state of each switch indicating that the respective conductive pin is properly mated with the circuit board.

14. The method of claim 13, wherein the press tool further includes a ground plate and each switch includes an electrical probe, the method further comprising:
   resting a plurality of probes on the ground plate so that the probes are grounded thereto; and
   lifting the probes off of the ground plate as a respective one of the conductive pins penetrate through the circuit board to create open circuit.

15. The method of claim 14, further comprising providing transfer elements received within holes in the press tool and holes in the ground plate, the transfer elements being aligned with corresponding conductive pins and probes, wherein when the conductive pins penetrate the circuit board, the transfer elements are moved through the ground plate, and wherein when the transfer elements are moved through the ground plate, the probes are lifted off the ground plate.

16. The apparatus of claim 1, further comprising transfer elements movably coupled within the detector housing, the transfer elements being a physical link between the switches and the conductive pins, at least a portion of the transfer elements being non-conductive such that the switches are electrically isolated from the conductive pins.

17. The apparatus of claim 1, further comprising transfer elements movable between a retracted position and an advanced position, the transfer elements being held within the detector housing in the retracted position and the transfer elements being forced out of the detector housing to the advanced position, the transfer elements engaging the switches to physically move the switches when the transfer elements are moved from the retracted position to the advanced position.

18. The apparatus of claim 1, further comprising transfer elements movably coupled within the detector housing, the transfer elements being configured to engage the conductive pins when the conductive pins are mated with the circuit board, the transfer elements being configured to engage the conductive pins either internal or external of the circuit board.

* * * * *